(12) United States Patent
Jones et al.

(10) Patent No.: US 7,843,257 B2
(45) Date of Patent: Nov. 30, 2010

(54) ACTIVE FILTER CALIBRATION METHOD AND APPARATUS

(75) Inventors: Theron Jones, White Heath, IL (US); Luiz Antonio Razera, Jr., San Jose, CA (US); Andrew Zocher, Monticello, IL (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 17 days.

(21) Appl. No.: 12/396,421

(22) Filed: Mar. 2, 2009

(65) Prior Publication Data

US 2010/0219883 A1    Sep. 2, 2010

(51) Int. Cl.
    *H04B 1/10*    (2006.01)
(52) U.S. Cl. ..................................... 327/553
(58) Field of Classification Search .............. 327/552, 327/553, 557
    See application file for complete search history.

(56) References Cited

U.S. PATENT DOCUMENTS

| | | | |
|---|---|---|---|
| 6,452,444 B1 * | 9/2002 | Mehr | 327/554 |
| 6,803,813 B1 * | 10/2004 | Pham | 327/553 |
| 7,078,961 B2 * | 7/2006 | Punzenberger et al. | 327/552 |
| 7,471,142 B2 * | 12/2008 | Li et al. | 327/553 |
| 7,477,099 B2 * | 1/2009 | Okamoto et al. | 327/553 |

* cited by examiner

*Primary Examiner*—Hai L Nguyen
(74) *Attorney, Agent, or Firm*—TIPS Group

(57) ABSTRACT

An example bandpass filter calibration system includes a MUX, first and second signal sources coupled to inputs of the MUX, a bandpass filter coupled to an output of the MUX, a rectification circuit including a plurality of rectifiers having a corresponding plurality of rectifier outputs coupled to an output of the bandpass filter, a summer having a plurality of inputs coupled to the plurality of rectifier outputs, a low pass filter coupled to an output of the summer, an ADC coupled to an output of the low pass filter, and a calibration processor unit coupled to an output of the ADC. The calibration processor unit controls the MUX to selectively apply the first signal source and the second signal source to the bandpass filter and calibrates the bandpass filter by a least one of increasing filter center frequency and decreasing filter center frequency of the bandpass filter.

20 Claims, 6 Drawing Sheets

ACTIVE FILTER CALIBRATION METHOD AND APPARATUS

CROSS REFERENCE TO RELATED APPLICATIONS

This application is related to U.S. Ser. No. 12/396,425 filed concurrently herewith and U.S. Ser. No. 12/396,422 filed concurrently herewith, both of which are incorporated herein by reference.

BACKGROUND

Important to many types of circuits is the correct calibration of active filters. There are a number of techniques for calibrating such filters. For example, filter calibration techniques that use a proxy oscillator are well known to those skilled in the art of integrated circuit active filter design.

However, proxy oscillator methods suffer from a number of weaknesses. For example, in some cases, the proxy oscillator consumes power and possibly generates noise when the filter is enabled. Furthermore, there is an inherent mismatch between the proxy oscillator and the filter resulting in inaccuracies and inefficiencies being injected into the calibration process.

U.S. Pat. No. 5,245,646 of Jackson et al. describes a filter calibration circuit that uses an R/C integrator with known initial conditions, a timing circuit, and a decoding circuit to stabilize the global R/C time constant on an integrated circuit (IC). U.S. Pat. No. 5,914,633 of Comino et al. describes a similar calibration circuit. In both, the calibration circuit is disabled after calibration to address the problems of power consumption and noise generation. However, the problems created by the mismatch between the proxy oscillator and the filter remain.

U.S. Pat. No. 7,345,490 of Ibrahim et al. describes an RSSI-based filter calibration system wherein a signal is applied to the filter in the pass band and then at the 3 dB point. The filter control is then adjusted until the converted RSSI value of the signal in the pass band is 3 dB higher than the signal generated at the desired 3 dB point. However, this system requires additional circuitry with fine frequency resolution to generate both the signal in the pass band and the signal at the 3 dB bandwidth.

These and other limitations of the prior art will become apparent to those of skill in the art upon a reading of the following descriptions and a study of the several figures of the drawing.

SUMMARY

In an embodiment, set forth by way of example and not limitation, a bandpass filter calibration apparatus includes a MUX having a plurality of inputs, an output and a control input, a first signal source coupled to a first input of the MUX, a second signal source coupled to a second input of the MUX, a bandpass filter having an input coupled to the output of the MUX, an output and a control input, a rectification circuit having an input coupled to an output of the bandpass filter, the rectification circuit including a plurality of rectifiers having a corresponding plurality of rectifier outputs, a summer having a plurality of inputs coupled to the plurality of rectifier outputs, a low pass filter having an input coupled to an output of the summer, an ADC having an input coupled to an output of the low pass filter, and a calibration processor unit having an input coupled to an output of the ADC, the calibration processor unit having a MUX control output coupled to the control input of the MUX and a filter control output coupled to the control input of the bandpass filter. In this example, the calibration processor unit controls the MUX to selectively apply the first signal source and the second signal source to the bandpass filter and calibrates the bandpass filter by a least one of increasing filter center frequency and decreasing filter center frequency.

In an embodiment, set forth by way of example and not limitation, a method for calibrating a bandpass filter includes: (a) applying a first frequency to an input of a bandpass filter having a filter center frequency and measuring first frequency amplitude derived from an output of the bandpass filter; (b) applying a second frequency to the input of the bandpass filter and measuring a second frequency amplitude derived from the output of the bandpass filter; (c) if the first frequency amplitude is not equal to the second frequency amplitude, increasing the filter center frequency if the first frequency amplitude is greater than the second frequency amplitude and decreasing the filter center frequency if the first frequency amplitude is less than the second frequency amplitude; and (d) repeating operations (a)-(d) until the first frequency amplitude is equal to the second frequency amplitude, whereby the bandpass filter is calibrated.

In an embodiment, set forth by way of example and not limitation, a bandpass filter calibration apparatus includes: (a) means corresponding to the structure, material, or acts described in the specification and equivalents thereof for applying a first frequency to an input of a bandpass filter having a filter center frequency and means corresponding to the structure, material, or acts described in the specification and equivalents thereof for measuring first frequency amplitude derived from an output of the bandpass filter; (b) means corresponding to the structure, material, or acts described in the specification and equivalents thereof for applying a second frequency to the input of the bandpass filter and means corresponding to the structure, material, or acts described in the specification and equivalents thereof for measuring a second frequency amplitude derived from the output of the bandpass filter; (c) means corresponding to the structure, material, or acts described in the specification and equivalents thereof for determining if the first frequency amplitude is not equal to the second frequency amplitude, means corresponding to the structure, material, or acts described in the specification and equivalents thereof for increasing the filter center frequency if the first frequency amplitude is greater than the second frequency amplitude and means corresponding to the structure, material, or acts described in the specification and equivalents thereof for decreasing the filter center frequency if the first frequency amplitude is less than the second frequency amplitude; and (d) means corresponding to the structure, material, or acts described in the specification and equivalents thereof for repeating operations (a)-(d) until the first frequency amplitude is equal to the second frequency amplitude, whereby the bandpass filter is calibrated.

Example embodiments described herein provide an accurate filter calibration circuit. This circuit keeps the transfer function of an integrated filter stable over variations in process, voltage and temperature (PVT).

Example embodiments described herein advantageously utilize very little additional circuitry to calibrate the filter. Proxy oscillators and/or decoders are not required.

These and other embodiments and advantages will become apparent to those of skill in the art upon a reading of the following descriptions and a study of the several figures of the drawing.

BRIEF DESCRIPTION OF THE DRAWINGS

Several example embodiments will now be described with reference to the drawings, wherein like components are provided with like reference numerals. The example embodiments are intended to illustrate, but not to limit, the invention. The drawings include the following example figures.

DETAILED DESCRIPTION OF EXAMPLE EMBODIMENTS

Figure 1:
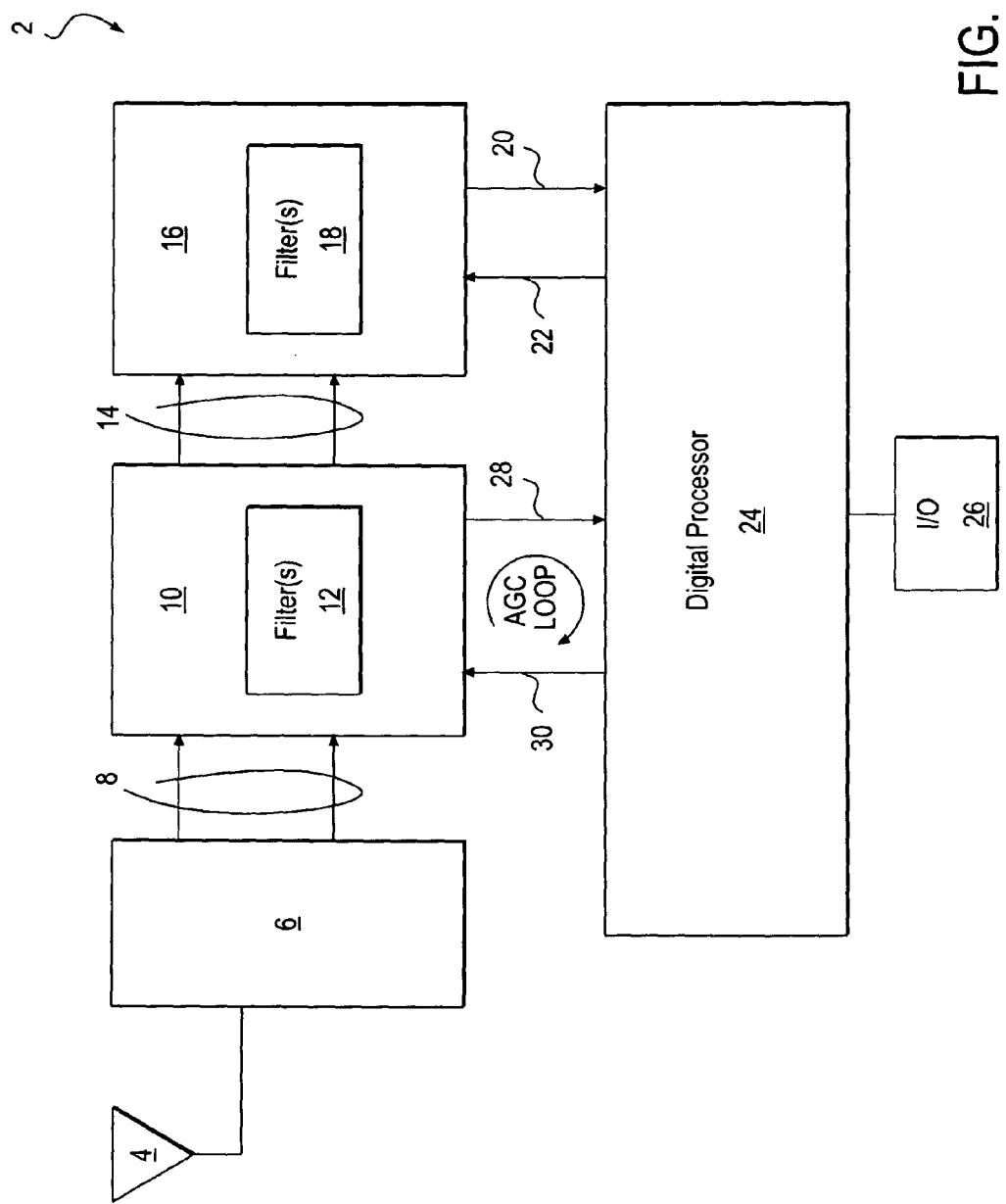
FIG. 1 is a block diagram of an example receiver with automatic gain control.

FIG. 1 is a block diagram illustrating a digital receiver system 2, set forth by way of example and not limitation. In this example, the digital receiver system 2 has an antenna 4 coupled to an antenna matching stage 6. Antenna matching stage 6 is coupled via a modulated signal input 8 to an AGC receiver 10. Antenna matching stage 6 typically comprises a network which matches the impedance of antenna 4 to the AGC receiver 10, as will be appreciated by those of skill in the art.

AGC receiver 10 includes circuitry to amplify and demodulate the signal received at modulated signal input 8. In certain example embodiments, the AGC receiver 10 includes one or more configurable filter(s) 12. AGC receiver 10 is coupled via signal output 14 to a digitization stage 16 which receives the demodulated signal and converts it to a digital waveform. In certain example embodiments, digitization stage 16 includes one or more configurable filter(s) 18.

Digitization stage 16 is coupled via digital signal output 20 to an input of digital processor 24. Digital processor 24 has an output 22 coupled to a control input of the digitization stage 16.

Digital processor 24 receives and post-processes the digital signal received via digital signal output 20. Digital processor is typically a microprocessor but may, in certain embodiments, be implemented otherwise. By way of non-limiting example, digital processor may be a state machine implemented by any number of well known technologies such as programmable gate arrays or a customized integrated circuit.

Digital processor 24 is coupled to I/O stage 26 which is used for various digital inputs and outputs including, without limitation, the output of the digital signal and external programmability of receiver with automatic gain control 2. In certain non-limiting example embodiments I/O stage 26 includes a serial peripheral interface (SPI).

In this example embodiment, digital processor 28 has a waveform input 28 coupled to the AGC which, in combination with the current gain setting, can be used to calculate a new gain setting. The gain setting, in this example, is provided as a digital word via AGC control output 30 which couples digital processor 28 to AGC receiver 10. AGC receiver 10 applies the gain setting received from AGC control output 30 to the modulated signal obtained from modulated signal input 8.

Figure 2:
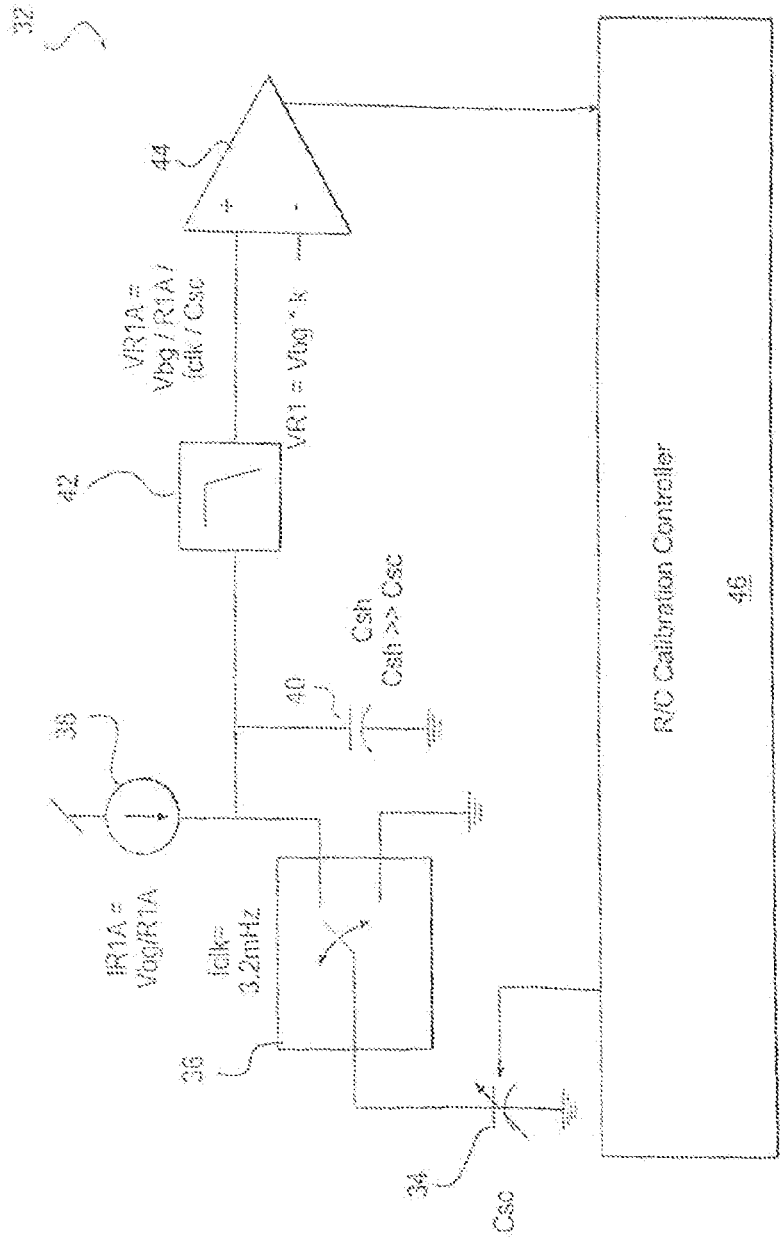
FIG. 2 is a block diagram of an example R/C calibration controller for filters, such as filters used in the example receiver of FIG. 1.

As will be appreciated by those of skill in the art, proper operation of digital receiver system 2 depends upon the correct calibration of various filters such as AGC receiver filter(s) 12 and digitization stage filter(s) 18. The manner in which the calibrations are performed may be chosen from a wide variety of methods known to those of skill in the art. FIG. 2 is a schematic diagram describing an example R/C time constant calibration circuit which has been found to be useful in certain example embodiments.

Example calibration circuit 32 as shown in FIG. 2 includes a switched capacitor (Csc) 34, a clock 36, a current source 38, a capacitor (Csh) 40, a low pass filter 42, a comparator 44 and an R/C calibration controller 46. It will be appreciated that the calibration circuit 32 operates as what is essentially a proxy oscillator; however the nature of this circuit is that it does not require a phase locked loop that certain other proxy oscillators use. As will be further appreciated by those skilled in the art, the voltage at capacitor 34 is known, because the current going into that node on the positive side of the capacitor is known, as is the clock frequency, and the value of the capacitor. As the switched capacitor 34 is charging and discharging, some residue associated with the clock is generated and capacitor 40 performs filtering on the clock residue. In addition, the filter 42 being calibrated is used, but at a frequency that is well below its cut-off frequency, such that the output of the filter is essentially a DC voltage.

A SAR algorithm embodied in the R/C calibration controller manipulates the switched capacitor 34 until the two D.C. voltages at the input of the comparator 44 converge. Once the D.C. values of the comparator 44 have converged, the R/C time constant is calibrated to within the ability to "tune" the switched capacitor 34. The SAR controller manipulates the capacitor code until:

$$VR1A=CR1$$

$$R1A*Csc=1/fclk/k$$

RC time constant is stable

An advantage of using this example approach is that it performs the desired calibration with minimal hardware, and thus a low-cost solution is provided. Further reduction of cost can be achieved by "borrowing" components from other portions of the receiver with automatic gain control 2 which are not in use at calibration time. For example, a sample and hold capacitor associated with an analog-to-digital converter (ADC) may be used for capacitor 40. Such "borrowing" can be achieved by isolating said components from the any other circuits using switches, as is well known to those skilled in the art.

Figure 3:
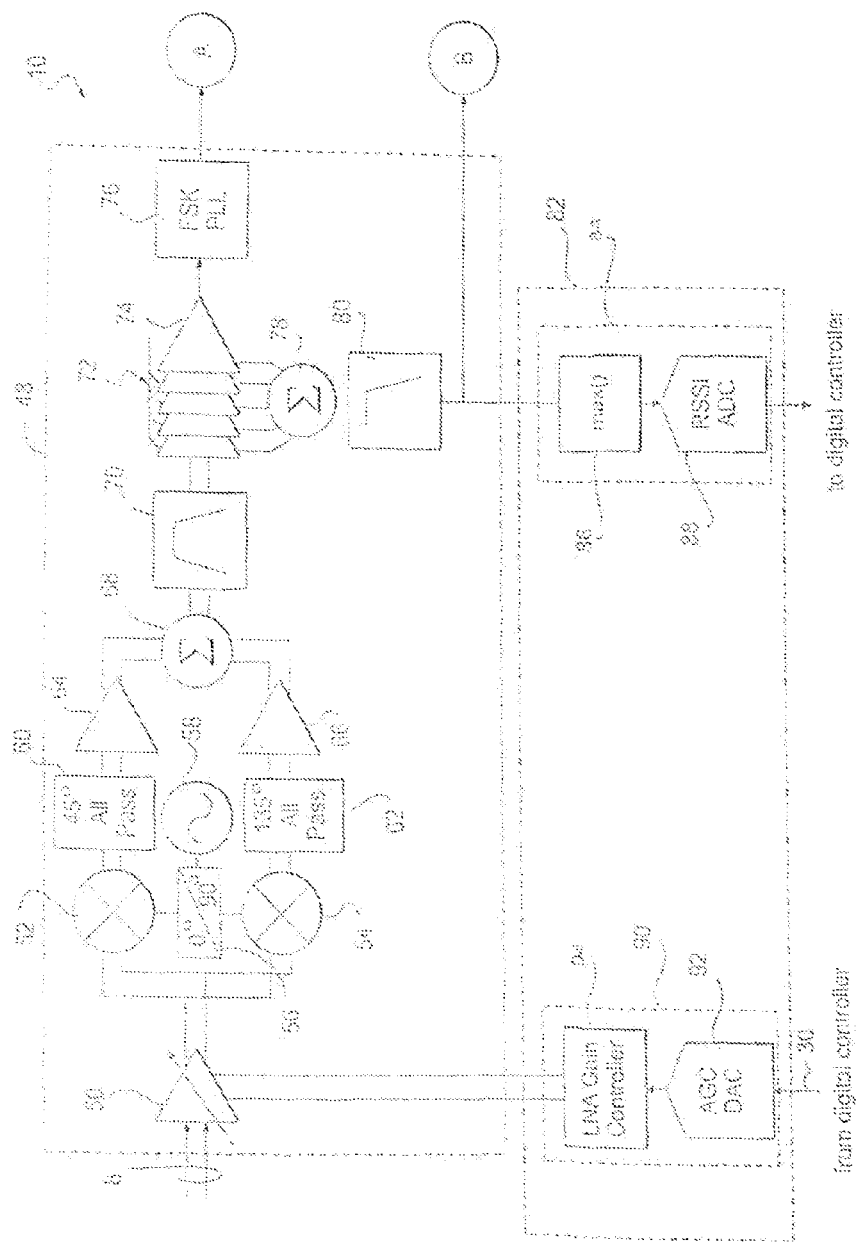
FIG. 3 is a is a block diagram of an example receiver stage and an example AGC stage of the receiver of FIG. 1.

FIG. 3. is a block diagram depicting example AGC receiver 10 of FIG. 1 in greater detail. AGC receiver 10 includes a receiver stage 48 having a variable gain preamplifier 50 which is coupled to modulated signal input 8. Variable gain preamplifier 50 amplifies the modulated signal and provides an amplified output signal to mixers 52 and 54 forming part of a superheterodyne intermediate frequency circuit. Mixers 52 and 54 are coupled to 0° and 90° phase shift outputs respectively of phase shifter 56 that is coupled to a local oscillator 58. This arrangement is used to "mix-down" the modulated signal to a lower or "intermediate" frequency so that the signal can be processed more easily, as will be appreciated by those skilled in the art.

Outputs of mixers 52 and 54 are coupled to a 45° all pass filter 60 and a 135° all pass filter 62, respectively. The 45° all pass filter 60 and the 135° all pass filter 62 perform an image reject on the output of mixers 52 and 54 respectively which effectively removes the image frequency. The outputs of 45° all pass filter 60 and 135° all pass filter 62 are coupled to the inputs of amplifiers 64 and 66 respectively. Amplifiers 64 and 66 are coupled to summer 68 which combines the phase shifted and amplified signals.

Summer 68 is coupled to a band pass filter 70 which receives the intermediate frequency modulated signal and performs a band selection function by applying a filter to select a band of interest. The output of band pass filter 70 is coupled to a rectification circuit 72 which includes of a number of rectifiers 74. A frequency modulation output of rectification circuit 72 is coupled to frequency shift keyed (FSK) phase locked loop (PLL) 76 which demodulates the frequency shift keyed signal if present. The demodulated output of FSK PLL 76 is provided as signal output of receiver stage 48 at a node A.

The outputs of rectifiers 74 are coupled to a summer 78 which adds the outputs of the several rectifiers. Persons of skill in the art will recognize the rectification circuit 72 and summer 78 as comprising an RSSI (Received Signal Strength Indicator) circuit. An output of summer 78 is coupled to a low pass filter 80 which filters noise associated with the rectified signal. The filtered signal, which includes an amplitude shift keyed signal, if present, is provided as signal output of receiver stage 48 at a node B. The filtered signal at node B is also an AGC output of receiver stage 48. The AGC output of receiver stage 48 provides signal strength information regardless of the type of modulation being used (e.g., AM, FM, etc.).

In the present example, the AGC output of receiver stage 48 is coupled to an input of matched AGC stage 82 which includes a feedback circuit 84. Feedback circuit 84 includes a peak detector 86, an input of which is coupled to the AGC output of receiver stage 48. Feedback circuit 84 further includes RSSI ADC 88, an input of which is coupled to an output of peak detector 86 which isolates the peaks of the received signal amplitude. RSSI ADC 88 converts the analog waveform to a digital waveform which describes the peaks of the signal amplitude. As will be appreciated by persons of skill in the art, the digital waveform is a gain feedback signal that can be used as part of the AGC loop.

RSSI ADC 88 is coupled via waveform input 28 to digital processor 24. Digital processor 24 analyzes the digital waveform, deriving a measured gain level. Digital processor 24 compares the difference between the desired gain and the measured gain. When a gain control change is required in accordance with the processes of digital processor 24, the new gain control setting is provided as a gain control signal via an AGC control output 30 of digital processor 24.

An input of matched AGC stage 82 is coupled to AGC control output 30. Matched AGC stage 82 further includes a control circuit 90, which is coupled to AGC control output 30. Control circuit 90 includes an AGC DAC 92 an input of which is coupled to AGC control output 30. The digital gain control signal, which in certain example embodiments is encoded as a digital input word, is converted from digital to analog via AGC DAC 92. Control circuit 90 further includes an LNA gain controller 94, an input of which is coupled to an output of AGC DAC 92. Outputs of LNA gain controller 94 are coupled to variable gain preamplifier 50, which applies the gain setting to the incoming modulated signal.

According to certain example embodiments, the transfer characteristics of control circuit 90 are matched to those of feedback circuit 84. Thus, the units of the digital waveform input provided by matched AGC stage 82 are the same as the units used to express the gain control signal provided by the digital processor 24 to the matched AGC stage 82.

In certain non-limiting example embodiments, the respective transfer characteristics of control circuit 90 and feedback circuit 84 are linear and have substantially the same composite slope such that the effect of any gain control change results in a predictable change in the amplitude of the demodulated signal. Since the composite slopes are linear, only a fast, efficient and straightforward difference calculation is needed to compute the gain control settings. Digital controller 24 attempts to set the gain directly to an optimal level based upon a digital waveform analysis derived from the gain feedback signal from feedback circuit 84. Unnecessary automatic gain control iterations or "hunting" associated with incremental AGC control of receiver stage 48 are thereby avoided.

According to certain non-limiting example embodiments, the filter being calibrated comprises of a number of transconductance (gm) cells or "gm-cells" and capacitors with certain bandpass characteristics. The transconductance of the gm cells and the values of the capacitors can vary with PVT (process, voltage and temperature) so a system to stabilize this transfer function is desirable.

Figure 4:
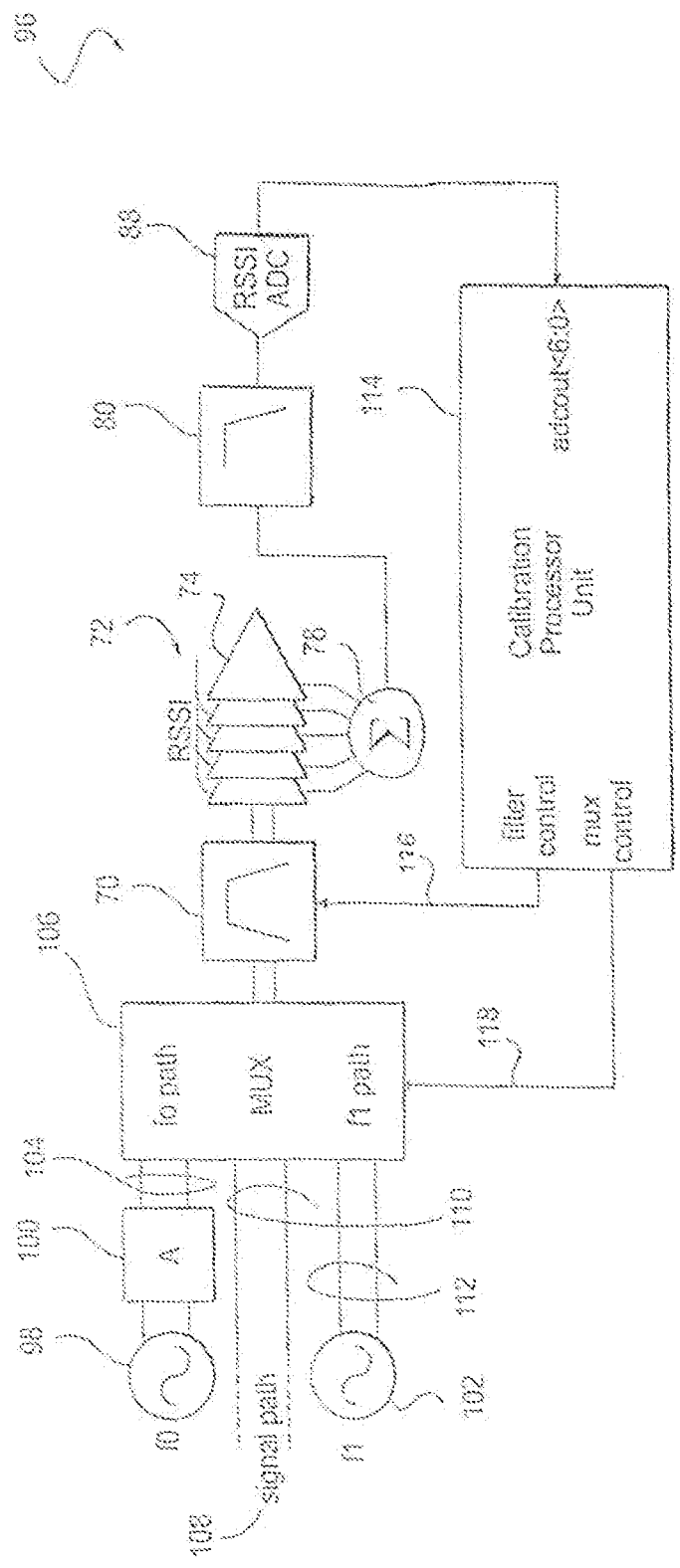
FIG. 4 is a block diagram of an embodiment of an active filter calibration circuit, set forth by way of example and not limitation.

FIG. 4 is a block diagram depicting an example bandpass filter calibration system 96 designed to select and set optimal values for bandpass filter settings such as, for example, a center frequency setting. The example filter calibration circuit described herein may be used in accordance with certain example embodiments to calibrate, for example, band pass filter 70 of FIG. 3. As will be appreciated by persons of skill in the art, various components may be "borrowed" and electrically isolated from other circuits using switches during calibration time so as to reduce component count.

A center frequency f0 oscillator 98 (i.e. an oscillator of a first frequency f0) is coupled to an attenuation circuit 100 which applies a constant factor "A" to the incoming oscillator signal. The attenuation factor "A" is set such that the center frequency is reduced to a level where the received signal strength can be expected to match the signal strength of higher frequency f1 oscillator 102 (i.e. an oscillator of a second, higher frequency f1) near the edge of the band of interest. In certain embodiments, f0 is in the range of about 50 to 320 kHz.

An output of attenuation circuit 100 is, in this example, coupled to an f0 path input 104 of MUX 106. MUX 106, at certain times during the calibration process is configured to allow the attenuated f0 signal to pass to an output of MUX 106.

A signal path 108 is coupled to a signal path input 110 of MUX 106. As will be appreciated by persons of skill in the art, once calibration is complete, MUX 106 allows a signal to flow from signal path input 110 to an output of MUX 106 to allow the received signal to be further processed.

A frequency f1 oscillator 102 near the edge of the band of interest is coupled to an f1 input 112 of MUX 106. At certain times during the calibration process MUX 106 is configured to allow the f1 oscillator signal to flow to an output of MUX 106.

An output of MUX 106 is coupled to an input of bandpass filter 70 which, after calibration, filters out unwanted signals such that the signal in the band of interest may be subsequently demodulated. At calibration time, an objective of certain example embodiments is to set the center frequency such that the signal strength of the attenuated f0 signal matches the signal strength of the f1 signal as it is attenuated by the "skirt" of band pass filter 70 near the edge of the band.

An output of bandpass filter 70 is coupled to an input of a rectification circuit 72. Rectification circuit 72 comprises a plurality of rectifiers 74 having a corresponding plurality of rectifier outputs coupled to a summer 78 which combines the signals from the plurality of rectifiers 74. Persons of skill in the art will appreciate that rectification circuit 72 may comprise an KSSI circuit. An output of summer 78 is coupled to a low-pass filter 80 which serves to reduce noise introduced by rectification circuit 72, as well as any other noise that may be present.

An output of low-pass filter 80 is coupled to an ADC 88 which converts the incoming signal strength into a digital word representing the signal strength numerically. Persons of skill in the art will appreciate that ADC 88 has a certain "resolution" which affects the precision with which it can represent signal strength. An output of ADC 88 is coupled to an input of calibration processor 114 such that the digital word representing signal strength is conveyed to calibration processor 114.

A filter control output 116 of calibration processor 114 is coupled to an input of bandpass filter 70 such that calibration processor 114 may apply new settings to control, for example, the center frequency of bandpass filter 70. During the calibration process, new settings may be repeatedly applied to bandpass filter 70 in order to converge on optimal settings, as will be appreciated by persons of skill in the art.

A MUX control output 118 of calibration processor 114 is coupled to an input of MUX 106 such that calibration processor 114 may apply, for example, a control signal to select which input of MUX 106 is to be electrically connected to an output of MUX 106. Persons of skill in the art will appreciate that MUX 106 may be repeatedly commanded to multiplex its inputs during the calibration process.

Figure 5:
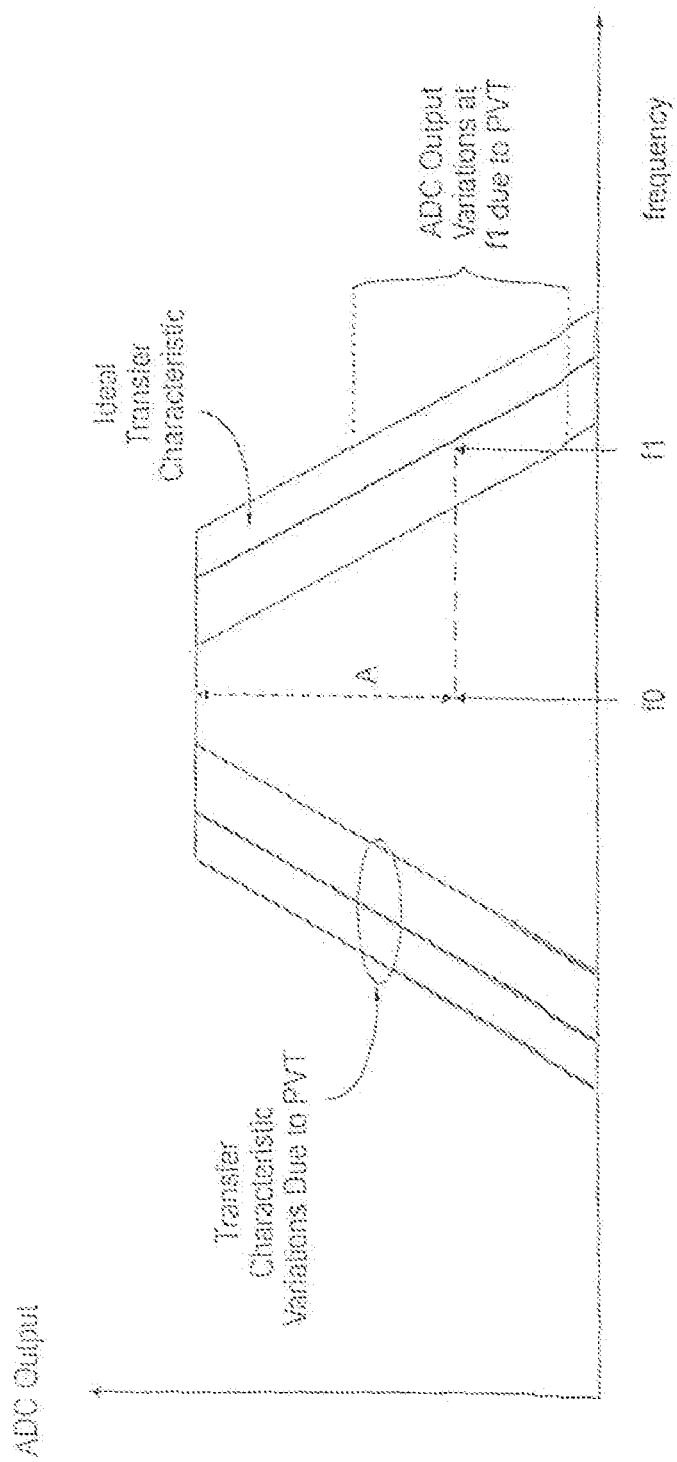
FIG. 5 is a diagram of example transfer characteristics of the circuit of FIG. 4.

FIG. 5 is a diagram depicting the transfer characteristics of bandpass filter 70 of FIG. 4. The diagram shows ADC Output on the vertical axis of the graph, and the frequency domain on the horizontal axis. With reference to FIG. 5, and with continuing reference to FIG. 4, a calibration processor 114 sets the initial filter control value. Next, it configures the MUX 106 so that a signal at the frequency f0 input 104, after being attenuated by a factor A by attenuation circuit 100, is applied to the input of bandpass filter 70. The output of the filter is then applied to, for example, a received signal strength (RSSI) detector depicted as rectification circuit 72.

The RSSI output voltage has a linear-in-dB characteristic with respect to input power. The RSSI voltage is filtered and converted to a digital code via an ADC 88. The calibration processor unit then configures MUX 106 so that a signal at the frequency f1 is applied to the input of bandpass filter 70.

As with the previous measurement, the output of bandpass filter 70 is applied to the RSSI detector depicted, in this example, as rectification circuit 72 and the RSSI voltage is filtered via low-pass filter 80 and converted to a digital code via the ADC 88. The two digital codes are compared. and the calibration processor unit varies the filter control code so that the two ADC output codes converge to the same value. When these two codes converge, it can be inferred that the filter transfer function has been stabilized.

In certain example embodiments, f1 is chosen to be 4/3*f0 and the ratio A is 17 dB. A typical value for f0 is 50 kHz although other frequencies are suitable for this and other applications. Taking this frequency as a non-limiting example, an f0 of about 50 kHz can, in certain embodiments, be associated with an f1 of about 66.7 kHz.

With certain example embodiments, the signal at f1 is well down the "skirt" of the transfer characteristic. By "skirt" it is meant, by way of non-limiting example, the high frequency sides of the transfer characteristics illustrated in FIG. 5. The attenuator value A is dependent on a ratio of resistors and so this value is very accurate. Also, when the filter calibration is complete, the attenuated and filtered signal at f0 and the filtered signal at f1 have the same magnitude at the ADC input. This fact eliminates any inaccuracies associated with ADC integral non-linearities (INL).

Figure 6:
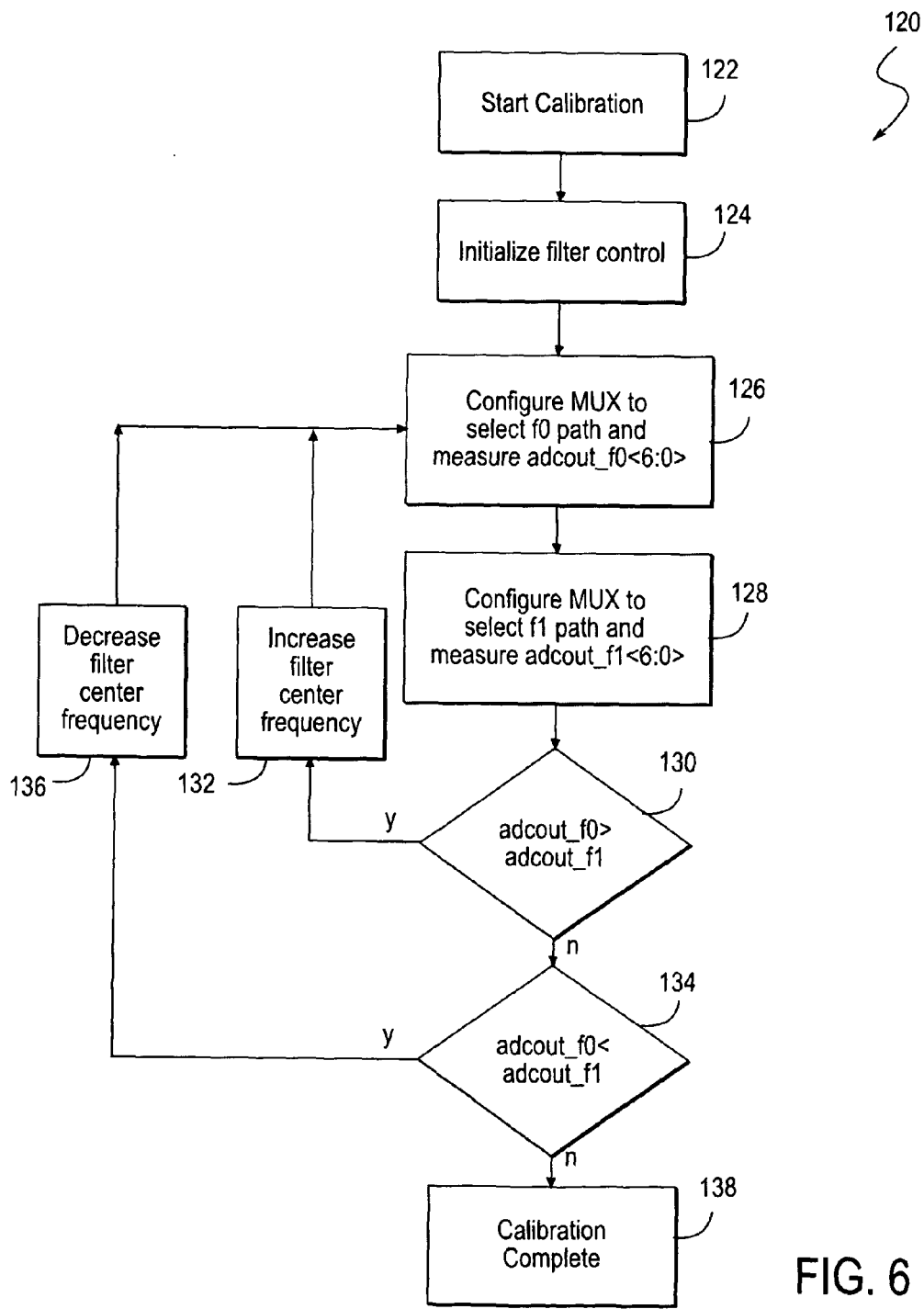
FIG. 6 is a flow diagram of an embodiment of an active filter calibration method, set forth by way of example and not limitation.

FIG. 6 is a flow diagram depicting a process 120 for calibrating bandpass filter 70 which can be implemented, for example, in calibration processor unit 114. That is, calibration processor unit 114 can be a microprocessor or some other form of digital processor such as a logic array, a state machine, etc. It may also be implemented on the digital processor 24 or elsewhere.

The process 120 begins in an operation 122 and continues in an operation 124 wherein the settings of bandpass filter 70 of FIG. 4 are initialized. An operation 126 then configures MUX 106 to select the f0 path, thus applying the attenuated f0 to an input of bandpass filter 70. Once the output of RSSI ADC 88 settles, a measurement of the digital output word representing the signal strength of the f0 signal provided by RSSI ADC 88, which was derived from an output of bandpass filter 70, is recorded.

Then, in an operation 128, MUX 106 is configured to select the f1 path, thus applying f1 to an input of bandpass filter 70. Once the output of RSSI ADC 88 settles, a measurement of the digital output word representing the signal strength of the f1 signal provided by RSSI ADC 88, which was derived from an output of bandpass filter 70, is recorded.

Then, in a decision operation 130, the measurement of the digital output word representing the signal strength of the f0 signal is compared to the measurement of the digital output word representing the signal strength of the f1 signal provided by RSSI ADC 88, and if measurement of the digital output word representing the signal strength of the f0 signal is greater than the measurement of the digital output word representing the signal strength of the f1 signal, then the operation continues in an operation 132 which incrementally increases the center filter frequency. The operation then continues with operation 126.

If in operation 130 it was determined that the measurement of the digital output word representing the signal strength of the f0 signal is not greater than the measurement of the digital output word representing the signal strength of the f1 signal provided by RSSI ADC 88, then the operation continues in a decision operation 134 in which the measurement of the digital output word representing the signal strength of the f0 signal is compared to the measurement of the digital output word representing the signal strength of the f1 signal provided by RSSI ADC 88, and if measurement of the digital output word representing the signal strength of the f0 signal is less than the measurement of the digital output word representing the signal strength of the f1 signal, then the operation continues in an operation 136 which incrementally decreases the center filter frequency. The operation then continues with operation 126.

If in operation 134 it was determined that the measurement recorded in operation 126 is not less than the measurement recorded in operation 128, then the operation continues in an operation 138 which, having determined that the signal strengths for f0 and f1 match within the resolution of RSSI ADC 88, bandpass filter 70 is considered to be calibrated and the operation is thus concluded.

It should be noted that as the incremental adjustments are being applied to the center frequency, both the low-frequency cut-off and the high-frequency cut-off of the bandpass filter track with the center frequency filter control. It should also be noted that this method is essentially a direct measurement of the frequency transfer characteristic of the filter and it does not rely on the matching between the filter and a proxy oscillator or calibration circuit.

Although various embodiments have been described using specific terms and devices, such description is for illustrative purposes only. The words used are words of description rather than of limitation. It is to be understood that changes and variations may be made by those of ordinary skill in the art without departing from the spirit or the scope of the present invention, which is set forth in the following claims. In addition, it should be understood that aspects of various other embodiments may be interchanged either in whole or in part. It is therefore intended that the claims be interpreted in accordance with the true spirit and scope without limitation or estoppel.

What is claimed is:

1. A bandpass filter calibration apparatus comprising:
   a MUX having a plurality of inputs, an output and a control input;
   a first signal source of a frequency f0 coupled to a first input of said MUX;
   a second signal source of a frequency f1 coupled to a second input of said MUX;
   a bandpass filter having an input coupled to said output of said MUX, an output and a control input;
   a rectification circuit having an input coupled to an output of said bandpass filter, said rectification circuit comprising a plurality of rectifiers having a corresponding plurality of rectifier outputs;
   a summer having a plurality of inputs coupled to said plurality of rectifier outputs;
   a low pass filter having an input coupled to an output of said summer;
   an ADC having an input coupled to an output of said low pass filter; and
   a calibration processor unit having an input coupled to an output of said ADC, said calibration processor unit having a MUX control output coupled to said control input of said MUX and a filter control output coupled to said control input of said bandpass filter, wherein said calibration processor unit controls said MUX to selectively apply said first signal source and said second signal source to said bandpass filter and calibrates said bandpass filter by a least one of increasing filter center frequency and decreasing filter center frequency.

2. A bandpass filter calibration apparatus as recited in claim 1 wherein said rectification circuit and said summer comprise an RSSI circuit.

3. A bandpass filter calibration apparatus as recited in claim 2 wherein said RSSI circuit has a linear-in-dB characteristic.

4. A bandpass filter calibration apparatus as recited in claim 3 wherein the transfer characteristic of said bandpass filter is approximately symmetrical around said center frequency.

5. A bandpass filter calibration apparatus as recited in claim 4 wherein said transfer function has a center frequency of f0.

6. A bandpass filter calibration apparatus as recited in claim 5 wherein a second frequency f1 greater than f0 is well down the skirt of the transfer characteristic.

7. A bandpass filter calibration apparatus as recited in claim 6 wherein f1 is approximately 4/3*f0.

8. A bandpass filter calibration apparatus as recited in claim 1 wherein said first signal source is coupled to said first input of said MUX by an attenuator having an value A.

9. A bandpass filter calibration apparatus as recited in claim 8 wherein said attenuator value A is dependent upon a ratio of resistors.

10. A bandpass filter calibration apparatus as recited in claim 9 wherein said attenuator value A is about 17 dB.

11. A method for calibrating a bandpass filter comprising:
   (a) applying a first frequency f0 to an input of a bandpass filter to define a filter center frequency and measuring a first frequency amplitude derived from an output of said bandpass filter;
   (b) applying a second frequency f1 to said input of said bandpass filter and measuring a second frequency amplitude derived from said output of said bandpass filter;
   (c) if the first frequency amplitude is not equal to the second frequency amplitude, increasing the filter center frequency if the first frequency amplitude is greater than the second frequency amplitude and decreasing the filter center frequency if the first frequency amplitude is less than the second frequency amplitude; and
   (d) repeating operations (a)-(d) until the first frequency amplitude is equal to the second frequency amplitude, whereby said bandpass filter is calibrated.

12. A method for calibrating a bandpass filter as recited in claim 11 further comprising attenuating an amplitude of said first frequency prior to its being input into said bandpass filter.

13. A method for calibrating a bandpass filter as recited in claim 12 wherein said attenuating an amplitude is dependent upon a ratio of resistors.

14. A method for calibrating a bandpass filter as recited in claim 13 wherein said attenuating an amplitude is by approximately 17 dB.

15. A method for calibrating a bandpass filter as recited in claim 11 wherein said second frequency amplitude is attenuated by a skirt of a transfer characteristic of said bandpass filter.

16. A method for calibrating a bandpass filter as recited in claim 15 wherein said second frequency is greater than said first frequency and is well down the skirt of said transfer characteristic.

17. A method for calibrating a bandpass filter as recited in claim 16 wherein the second frequency is approximately 4/3 time the first frequency.

18. A system for calibrating a bandpass filter comprising:
   (a) means for applying a first frequency to an input of a bandpass filter having a filter center frequency and means for measuring first frequency amplitude derived from an output of said bandpass filter;
   (b) means for applying a second frequency to said input of said bandpass filter and means for measuring a second frequency amplitude derived from said output of said bandpass filter;
   (c) means for determining if the first frequency amplitude is not equal to the second frequency amplitude, means for increasing the filter center frequency if the first frequency amplitude is greater than the second frequency amplitude and means for decreasing the filter center frequency if the first frequency amplitude is less than the second frequency amplitude; and (d) means for repeating operations (a)-(d) until the first frequency amplitude is equal to the second frequency amplitude, whereby said bandpass filter is calibrated.

19. A system for calibrating a bandpass filter as recited in claim 18 wherein said means for applying said first frequency includes an attenuator.

20. A system for calibrating a bandpass filter as recited in claim 19 wherein said second frequency amplitude is attenuated by said bandpass filter.

* * * * *